(12) United States Patent
Kifer et al.

(10) Patent No.: US 9,119,324 B2
(45) Date of Patent: Aug. 25, 2015

(54) ELECTRICAL COMPONENT OF A MOTOR VEHICLE

(75) Inventors: Alexander Kifer, Mistelbach (DE); Klaus Zaps, Volkach-Astheim (DE); Peter Hauck, Gerbrunn (DE)

(73) Assignee: BROSE FAHRZEUGTEILE GMBH & CO. KG, HALLSTADT, Hallstadt (DE)

( * ) Notice: Subject to any disclaimer, the term of this patent is extended or adjusted under 35 U.S.C. 154(b) by 371 days.

(21) Appl. No.: 13/388,959

(22) PCT Filed: Jul. 14, 2010

(86) PCT No.: PCT/EP2010/004282
§ 371 (c)(1),
(2), (4) Date: Apr. 23, 2012

(87) PCT Pub. No.: WO2011/015275
PCT Pub. Date: Feb. 10, 2011

(65) Prior Publication Data
US 2012/0319511 A1 Dec. 20, 2012

(30) Foreign Application Priority Data
Aug. 5, 2009 (DE) .......................... 10 2009 036 128

(51) Int. Cl.
| | |
|---|---|
| *H02K 3/28* | (2006.01) |
| *H05K 3/20* | (2006.01) |
| *H02K 3/52* | (2006.01) |
| *H02K 5/08* | (2006.01) |
| *H05K 3/10* | (2006.01) |

(52) U.S. Cl.
CPC ................ *H05K 3/202* (2013.01); *H02K 3/522* (2013.01); *H02K 5/08* (2013.01); *H05K 3/103* (2013.01); *H05K 2201/0382* (2013.01); *H05K 2201/09118* (2013.01); *H05K 2201/10287* (2013.01); *H05K 2201/10598* (2013.01); *Y10T 29/49117* (2015.01)

(58) Field of Classification Search
CPC .......... H02K 5/225; H02K 3/50; H02K 3/522
USPC ............................................... 310/71; 174/98
See application file for complete search history.

(56) References Cited

U.S. PATENT DOCUMENTS

| | | | |
|---|---|---|---|
| 5,097,592 A | 3/1992 | Schultz et al. | |
| 6,142,806 A | 11/2000 | Yamashita et al. | |
| 6,439,907 B1 * | 8/2002 | Rowe | 439/196 |
| 6,737,773 B2 * | 5/2004 | Hayashi et al. | 310/71 |
| 6,930,418 B2 * | 8/2005 | Kobayashi et al. | 310/71 |
| 6,945,756 B2 * | 9/2005 | Hartel et al. | 417/360 |

(Continued)

FOREIGN PATENT DOCUMENTS

| | | |
|---|---|---|
| DE | 10261611 | 7/2004 |
| DE | 10318816 | 11/2004 |

(Continued)

*Primary Examiner* — Alex W Mok
(74) *Attorney, Agent, or Firm* — Pauly, DeVries, Smith & Deffner, LLC

(57) ABSTRACT

Disclosed is an electrical component of a motor vehicle, having a plastic housing and a conductor track structure which is at least substantially embedded in the plastic housing in the injection-molding method and is intended to provide the electrical connections required for operation. The conductor track structure includes—separate wires which each do not run in a straight line, and that any deviation from a straight course of the wires goes back solely to a corresponding bending operation in terms of manufacturing.

17 Claims, 5 Drawing Sheets

(56) References Cited

U.S. PATENT DOCUMENTS

| | | | |
|---|---|---|---|
| 7,034,419 B2 * | 4/2006 | Kabasawa et al. | 310/71 |
| 2007/0296292 A1 * | 12/2007 | Kienzler et al. | 310/71 |
| 2008/0265701 A1 * | 10/2008 | Ueda et al. | 310/71 |
| 2009/0015079 A1 * | 1/2009 | Riedl et al. | 310/50 |
| 2009/0039720 A1 * | 2/2009 | Tsukashima et al. | 310/71 |
| 2010/0141067 A1 * | 6/2010 | Kitagawa | 310/71 |
| 2010/0156208 A1 * | 6/2010 | Schaflein et al. | 310/71 |

FOREIGN PATENT DOCUMENTS

| | | |
|---|---|---|
| EP | 0510843 | 12/1995 |
| WO | WO 2009025144 A1 * | 2/2009 |

* cited by examiner

1

ELECTRICAL COMPONENT OF A MOTOR VEHICLE

CROSS-REFERENCE TO RELATED APPLICATIONS

This application is a national stage application under 35 U.S.C. 371 of International Patent Application Serial No. PCT/EP2010/004282 entitled "ELECTRICAL COMPONENT OF A MOTOR VEHICLE," filed Jul. 14, 2010, which claims priority from German Patent Application No. 10 2009 036 128.6, filed Aug. 5, 2009.

FIELD OF THE INVENTION

The invention relates to electrical components of a motor vehicle and to methods for producing such components.

The electrical component in question may be, for example, a drive for a window winder, a drive for adjusting a seat, a motor vehicle lock or the like. All of these electrical components are generally provided with actuators and sensors which require electrical supply and signal lines.

However, the electrical component in question may also be a subcomponent of an electric motor, for example. In one variant, it is a connection element for connecting the stator windings of an electric motor. Other variants are conceivable.

BACKGROUND OF THE INVENTION

In order to be able to produce the electrical connections which are required for operation in a cost-effective manner, a conductor track structure which is at least substantially embedded in the plastic housing of the electrical component is regularly used. This embedding is carried out, for example, when producing the plastic housing in the injection-molding method.

In the known electrical component (EP 0 510 843 B1) on which the invention is based, the conductor track structure is designed as a leadframe. Such leadframes are regularly punched from conductive sheet metal in a punching operation. The resultant conductor tracks are connected to one another at predetermined locations after the punching operation, with the result that the leadframe can be handled as a whole and does not fall apart. In this state, the leadframe is supplied to an injection-molding process in which the plastic housing is injection-molded with the inclusion of the leadframe. The connections which still exist are then electrically interrupted.

The disadvantage of the known production of the conductor track structure is first of all the fact that the course of the wires is subject to tight restrictions. It goes without saying that it is not possible for the individual conductors to cross over on account of the punching process.

Furthermore, the disadvantage of the conductor track structure in the form of a leadframe is that targeted coating, for example of a particular section of a particular conductor, is possible only with a large amount of effort since the leadframe can be handled only as a whole.

SUMMARY OF THE INVENTION

The invention is based on the problem of increasing the design freedom for the electrical component and optimizing manufacturability.

In the case of an electrical component having a plastic housing and a conductor track structure which is at least substantially embedded in the plastic housing in the injection-molding method and is intended to provide the electrical connections required for operation, the above problem is solved by having the conductor track structure consist of separate wires which each do not run in a straight line, wherein any deviation from a straight course of the wires goes back solely to a corresponding bending operation in terms of manufacturing.

The important factor is the consideration of forming the conductor track structure from separate wires which each do not run in a straight line, any deviation from a straight course of the wires going back solely to a corresponding bending operation in terms of manufacturing.

Any desired course of the conductors can be achieved as a result of the proposed solution. It is also readily possible to implement crossing conductors, naturally only insofar as the conductors are appropriately insulated with respect to one another.

According to a further teaching with an independent meaning, the above problem is solved, in the case of an electrical component, having a plastic housing and a conductor track structure (1) which is clipped into the plastic housing and is intended to provide the electrical connections required for operation, by having the conductor track structure consist of separate wires which each do not run in a straight line, wherein any deviation from a straight course of the wires goes backs solely to a corresponding bending operation in terms of manufacturing.

This further teaching provides for the conductor track structure to be clipped into the plastic housing and for the conductor track to consist, for the rest, of separate wires which each do not run in a straight line, any deviation from a straight course of the wires going back, as above, solely to a corresponding bending operation in terms of manufacturing.

It has thus been recognized that bent wires can also be advantageously used in a conductor track structure which has been clipped into the plastic housing. In this case too, the great flexibility in terms of the design and the cost-effective feasibility are particularly favorable.

It has already been pointed out that the proposed electrical component may be any component of a motor vehicle. In the preferred embodiment, the proposed electrical component is in the form of a connection element for connecting the stator windings of an electric motor. Even complicated connections of the stator windings can be achieved in a cost-effective manner with the proposed implementation of the conductor track structure from wires which have been clipped in.

According to a further teaching likewise with an independent meaning, the above problem is solved, in the case of a method for producing an electrical component of a motor vehicle, the electrical component having a conductor track structure for providing the electrical connections required for operation, which conductor track structure is at least substantially embedded in the plastic housing in the injection-molding method, by having the conductor track structure bent from separate wires before being embedded in the plastic housing, wherein any deviation from a straight course of the wires goes back solely to a corresponding bending operation.

The important factor here is that the conductor track structure is bent from wires before being embedded in the plastic housing, and that any deviation from a straight course goes back solely to a corresponding bending operation.

It already emerges from the above explanations that the design freedom when implementing the conductor track structure is increased to a very considerable extent thereby. The possibility of individual conductors crossing over has already been pointed out.

According to a further teaching likewise with an independent meaning, the above problem is solved, in the case of a method for producing an electrical component of a motor vehicle, the electrical component having a conductor track structure for providing the electrical connections required for operation, which conductor track structure is at least substantially clipped into the plastic housing, by having the conductor track structure bent from separate wires before being clipped into the plastic housing, and wherein any deviation from a straight course of the wires goes back solely to a corresponding bending operation.

According to this further teaching, it has been recognized that the conductor track structure consisting of bent wires can also be advantageously used in a production method in which the conductor track structure is clipped into the plastic housing, as explained above.

Bending the wires to form a conductor track structure, on the one hand, and clipping in the resultant conductor track structure, on the other hand, overall result in excellent flexibility in terms of the design and in particularly low production costs.

The preferred embodiment provides for at least sections of at least one part of the wires to be respectively subsequently treated after bending. This subsequent treatment preferably goes back to a coating.

As a result of the fact that the individual conductors are bent from separate wires, this coating can be readily restricted to selected conductors. It is also conceivable for only a very particular section of these conductors to be coated.

In one embodiment, the invention provides an electrical component of a motor vehicle, having a plastic housing and a conductor track structure which is at least substantially embedded in the plastic housing in the injection-molding method and is intended to provide the electrical connections required for operation, wherein the conductor track structure includes separate wires which each do not run in a straight line, and wherein any deviation from a straight course of the wires goes back solely to a corresponding bending operation in terms of manufacturing.

In one embodiment, the invention provides an electrical component of a motor vehicle, having a plastic housing and a conductor track structure which is clipped into the plastic housing and is intended to provide the electrical connections required for operation, wherein the conductor track structure includes separate wires which each do not run in a straight line, and wherein any deviation from a straight course of the wires goes backs solely to a corresponding bending operation in terms of manufacturing.

In one embodiment, at least one part of the wires is bent in a three-dimensional manner.

In one embodiment, at least one part of the wires, in particular each with an end section, projects from the plastic housing for the purpose of making contact or the like.

In one embodiment, at least sections of at least one part of the wires is respectively subsequently treated, in particular coated, preferably wherein the coating is a tin, copper, nickel, silver or gold coating.

In one embodiment, the wires run substantially along a housing wall or the like, preferably wherein the wires cross over at one location or at a plurality of locations.

In one embodiment, the electrical component is in the form of a drive for a window winder, a drive for adjusting a seat, a motor vehicle lock or the like.

In one embodiment, the electrical component is in the form of a connection element for connecting the stator windings of an electric motor via the conductor track structure, and wherein the plastic housing forms a substantially annular supporting element for accommodating the conductor track structure, which supporting element is arranged, in the mounted state, coaxially with respect to a motor shaft at an end of the stator.

In one embodiment, the supporting element has accommodating parts for the wires of the conductor track structure, and wherein the wires are clipped into the accommodating parts, preferably wherein the wires are clipped into the accommodating parts with elastic deformation of the accommodating parts, also preferably wherein the accommodating parts are formed by wall sections of the supporting element, in particular by recesses in wall sections of the supporting element.

In one embodiment, the supporting element has a top side and an underside which are axially opposite based on the motor shaft, wherein one part of the wires is inserted into the top side of the supporting element, and wherein the other part of the wires is inserted into the underside of the supporting element. In one embodiment, at least sections of the supporting element have annularly running grooves for accommodating the wires.

In one embodiment, the supporting element has, in particular, axial guides for the winding ends of the stator windings, and wherein the winding ends run through the guides of the supporting element in the axial direction based on the motor shaft, preferably wherein each of the guides forms an aperture in the supporting element, also preferably wherein the apertures are each provided with a funnel-shaped molded portion which faces the stator windings and is intended to center the respective winding end during mounting.

In one embodiment, sections of the wires substantially follow the ring shape of the supporting element and have contact outwardly bent portions for contact with the winding ends, preferably wherein the contact outwardly bent portions are oriented radially inward based on the motor shaft.

In one embodiment, at least one part of the wires has a connection outwardly bent portion for electrically connecting the stator, wherein the stator can be connected to a control unit or the like via the connection outwardly bent portions, and wherein the connection outwardly bent portions are axially oriented, preferably wherein the connection outwardly bent portions are uniformly distributed over the periphery of the supporting element.

In another embodiment, the invention provides a method for producing an electrical component of a motor vehicle, the electrical component having a conductor track structure for providing the electrical connections required for operation, which conductor track structure is at least substantially embedded in the plastic housing in the injection-molding method, wherein the conductor track structure is bent from separate wires before being embedded in the plastic housing, and wherein any deviation from a straight course of the wires goes back solely to a corresponding bending operation.

In another embodiment, the invention provides a method for producing an electrical component of a motor vehicle, the electrical component having a conductor track structure for providing the electrical connections required for operation, which conductor track structure is at least substantially clipped into the plastic housing, wherein the conductor track structure is bent from separate wires before being clipped into the plastic housing, and wherein any deviation from a straight course of the wires goes back solely to a corresponding bending operation.

In one embodiment, the wires to be bent differently are bent separately, in particular in a parallel manner, on different bending machines.

In one embodiment, at least sections of at least one part of the wires are respectively subsequently treated, in particular coated, after bending, preferably wherein the coating is a tin, copper, nickel, silver or gold coating.\

In another embodiment, the wires are fixed relative to one another after bending and optionally provided subsequent treatment, preferably wherein the fixing is effected by encapsulating the wires in the plastic injection-molding method.

BRIEF DESCRIPTION OF THE FIGURES

The invention is explained in more detail below using exemplary embodiments. In the drawing.

DETAILED DESCRIPTION

Figure 1:
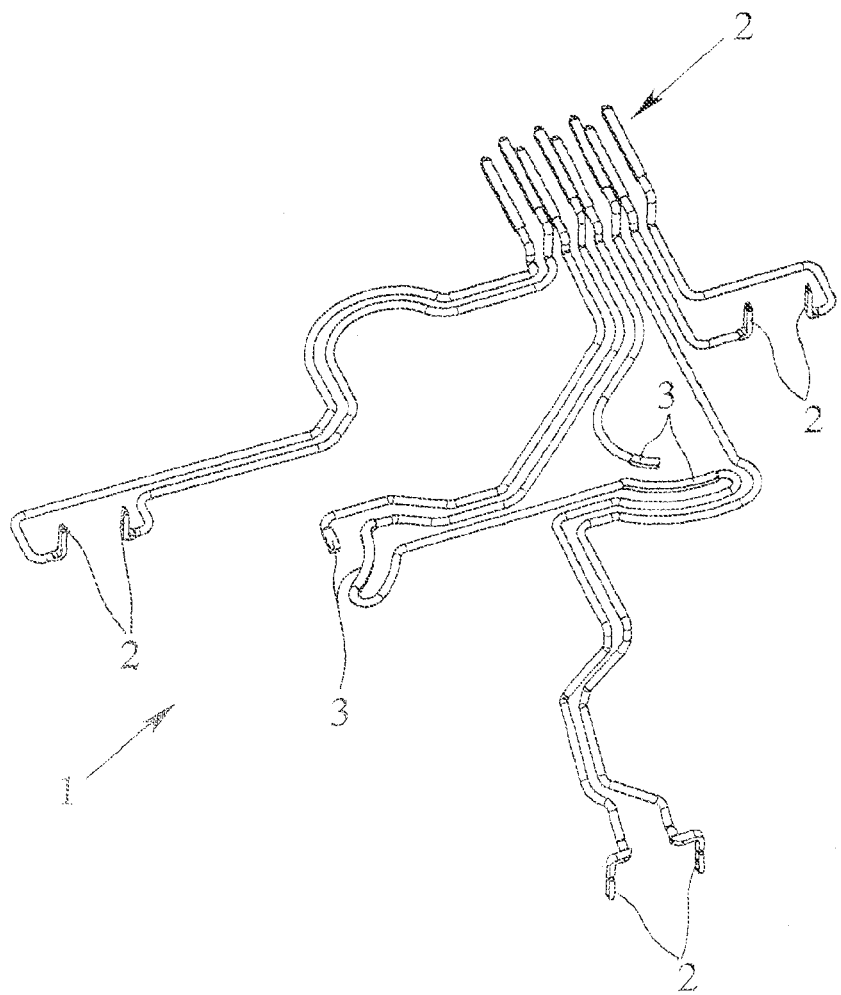
FIG. 1 shows a proposed conductor track structure as such.

The conductor track structure 1 illustrated in FIG. 1 is assigned to a proposed electrical component of a motor vehicle and is used to provide the electrical connections required for the operation of the electrical component. The electrical component is provided with a plastic housing (not illustrated) in which the conductor track structure 1 is at least substantially embedded.

In a first alternative to which a first teaching relates, the conductor track structure 1 is embedded during the production of the plastic housing in the injection-molding method. In a second alternative to which a further, independent teaching relates, the conductor track structure 1 is clipped into the plastic housing.

It can be gathered from the illustration in FIG. 1 that the conductor track structure 1 consists of separate wires which each do not run in a straight line, and that any deviation from a straight course of the wires goes back solely to a corresponding bending operation in terms of manufacturing. Punching of the conductors is thus expressly no longer provided.

With the bending of the wires, it is also readily conceivable for at least one part of the wires to be bent in a three-dimensional manner.

It can also be gathered from the illustration in the drawing that at least one part of the wires is bent in such a manner that, in particular, end sections 2 of the wires project from the plastic housing for the purpose of making contact or the like. In principle, the wires may also provide wiper tracks 3 which accordingly project from the plastic housing. These wiper tracks 3 may each be part of a potentiometer arrangement for measuring the position of levers or the like.

A subsequent treatment, in particular a coating, may be advantageous, in particular for that part of the wires which projects from the plastic housing. This subsequent treatment is preferably restricted precisely to that section of the respective wires which projects from the plastic housing.

The coating is preferably a tin, copper, nickel, silver or gold coating. Other types of coating are conceivable.

In this case, a substantial part of the conductor track structure 1 is preferably flat. This is useful if the wires are intended to run substantially along a housing wall or the like. The advantage of the proposed solution is then the fact that the wires can cross over at one location or at a plurality of locations if a corresponding insulating layer remains between the wires.

All types of wires can be used to implement the proposed solution. In this case, wires having a round or rectangular cross section should be primarily mentioned, the diameter of the wire having a round cross section preferably being between 0.4 mm and 1.8 mm and the edge lengths of the wire having a rectangular cross section preferably being between 0.2 mm and 1.8 mm. The dimensions of the wire having a rectangular cross section are particularly advantageously approximately 1.5 mm×0.7 mm or 0.2 mm×0.7 mm, for example.

The proposed solution also enables a design of the conductor track structure 1 oriented to the respective application. This is because it is possible to select accordingly different wires, possibly with different cross-sectional dimensions, for the different conductors. This may result in savings in terms of material and thus in terms of costs.

The proposed solution can be applied to all possible electrical components of a motor vehicle. In this context, reference may be made, for example, to a drive for a window winder, a drive for adjusting a seat and a motor vehicle lock or the like.

Figure 2:
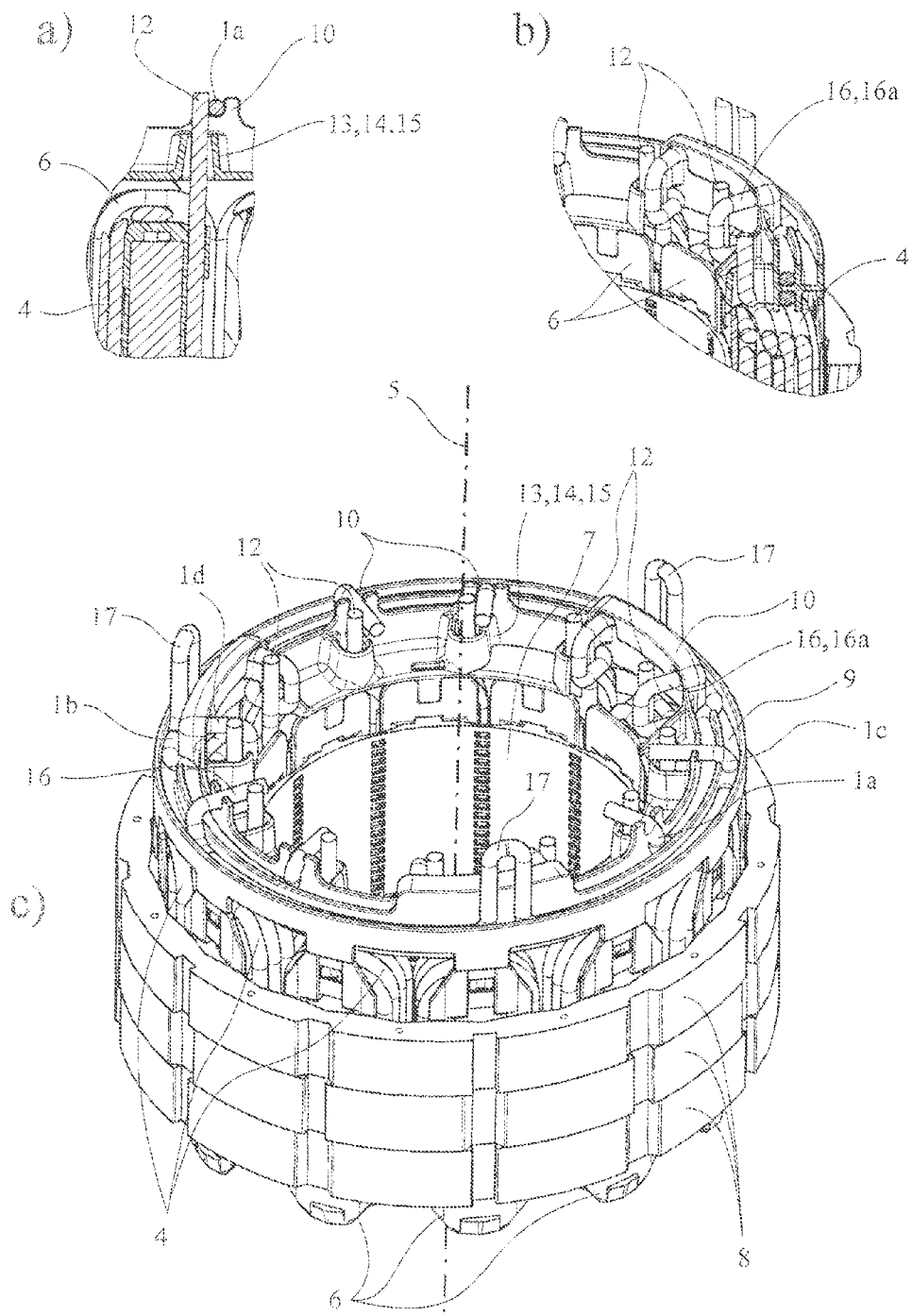
FIG. 2 shows the stator of an electric motor, which is assigned a proposed electrical component in the form of a connection element, a) in a sectional view in the region of a winding end, b) in a perspective detailed view and c) in a perspective overall view.

In a particularly advantageous manner, the proposed solution can be applied to an electrical component which is in the form of a connection element for connecting the stator windings 4 of the stator of an electric motor. FIG. 2 shows the stator of such an electric motor, for example. The electric motor may be a brushless DC motor, a three-phase AC motor or the like. All explanations of variants of the conductor track structure 1 illustrated in FIG. 1 accordingly apply to the connection element illustrated in FIGS. 2 to 5.

The stator windings 4 of the stator illustrated in FIG. 2 are distributed over the periphery of the stator and are oriented to the motor shaft 5 which is only suggested. The stator windings 4 are placed, via coil formers 6, onto a stator star consisting of laminated stator laminates 7. The stator star and the stator windings 4 are surrounded by a yoke pack 8.

Different variants for electrically connecting the stator windings 4 via the conductor track structure 1 are conceivable. In the embodiment which is illustrated in FIG. 2 and is preferred in this respect, the total of twelve stator windings 4 are connected to form a star connection. In this case, two adjacent stator windings 4 in each case are first of all directly connected in series. The total of six series circuits are connected in parallel in pairs and, in this parallel circuit, respectively form one of the three star arms of the star connection.

In this case, the plastic housing of the electrical component preferably forms a substantially annular supporting element 9 for accommodating the conductor track structure 1. In the exemplary embodiment which is illustrated in FIG. 2 and is preferred in this respect, the supporting element 9 is arranged, in the mounted state, in a coaxial manner with respect to the motor shaft 5 on an end of the stator, in particular is attached to this end of the stator.

Figure 4:
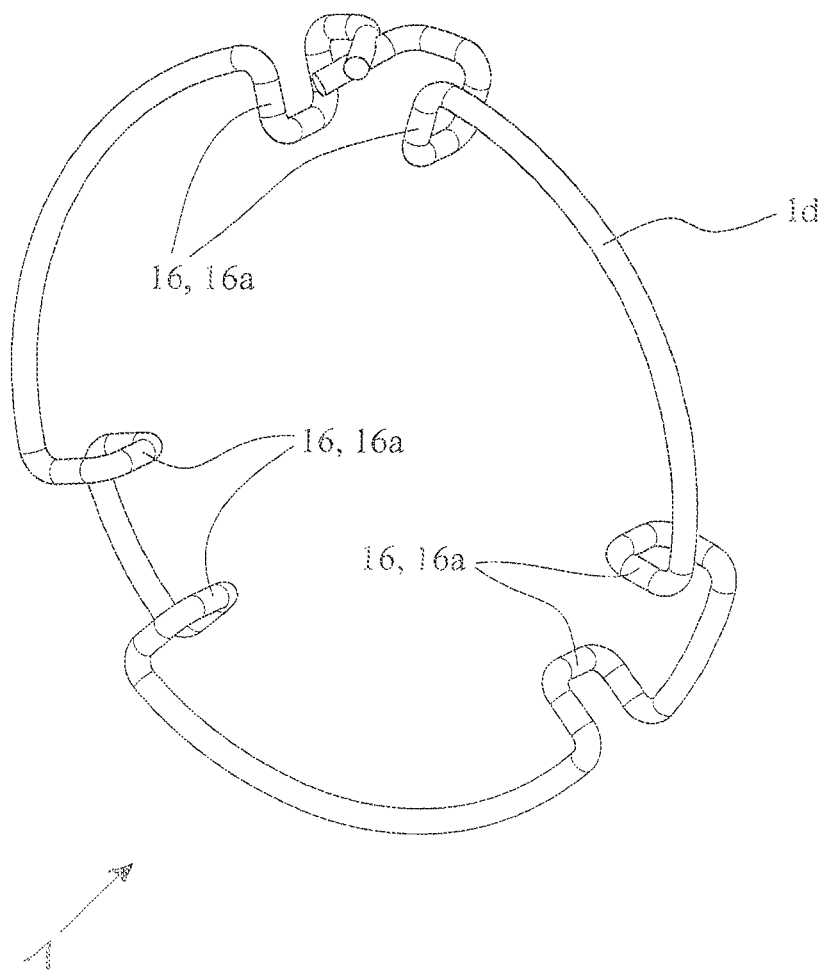
FIG. 4 shows a wire, assigned to the underside of the connection element according to FIG. 3, of the conductor track structure there.

In the exemplary embodiment which is illustrated in FIG. 2 and is preferred in this respect, the conductor track structure 1 consists of a total of four wires 1a-1d which are accommodated by the supporting element 9 separately from one another. In this case, the wires 1a, 1b and 1c each substantially form ring sections (FIG. 5), while the wire 1d forms a closed ring (FIG. 4). In the present case, the wire 1d provides the star point of the star connection.

The two ends of the wire 1d (FIG. 4) are connected to one another by means of hot caulking or the like. A crossed-over arrangement of these ends is achieved in this case. This arrangement ensures a certain mechanical stability for the supporting element 9 overall.

Figure 5:
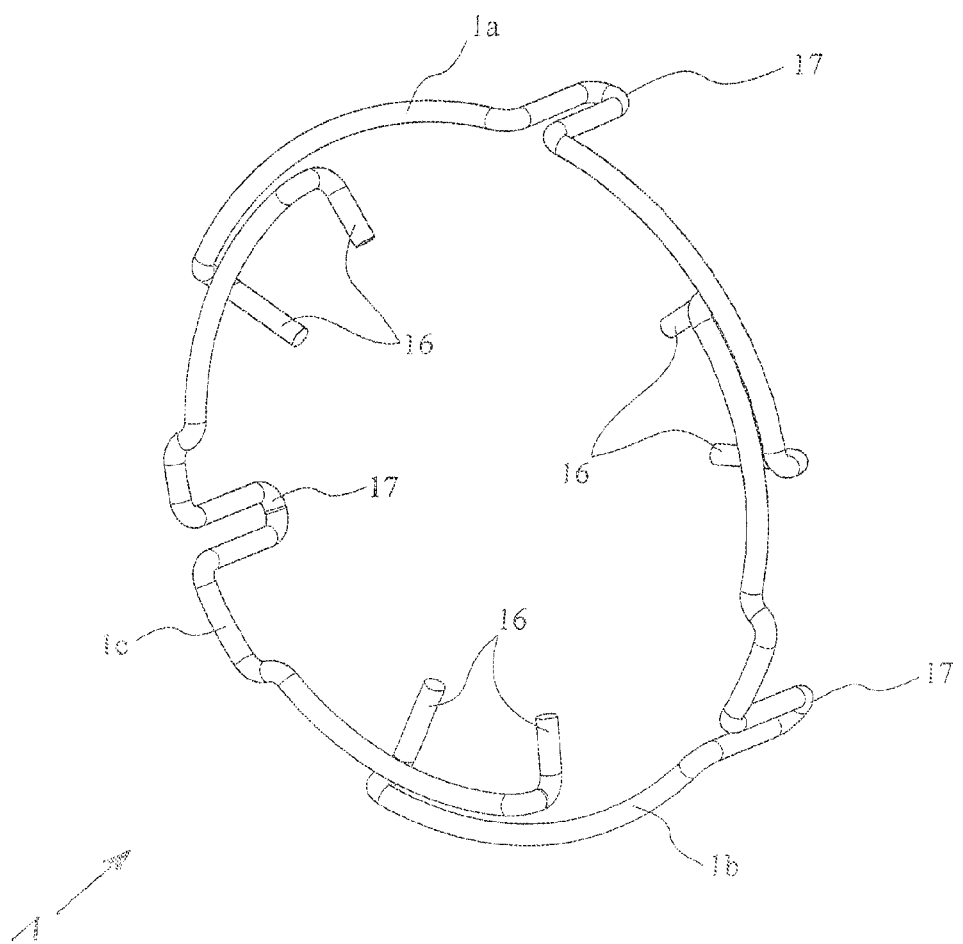
FIG. 5 shows three wires, assigned to the top side of the connection element according to FIG. 3, of the conductor track structure there.

The supporting element 9 has a top side, which is illustrated in FIG. 3a), and an underside which is illustrated in FIG. 3b). The top side and underside of the supporting element 9 are axially opposite based on the motor shaft 5. The interesting fact in this case is that one part of the wires 1a-1d, namely the wires 1a-1c illustrated in FIG. 5, is inserted into the top side of the supporting element 9 and that the other part of the wires 1a-1d, namely the wire 1d illustrated in FIG. 4, is inserted into the underside 9b of the supporting element 9.

Figure 3:
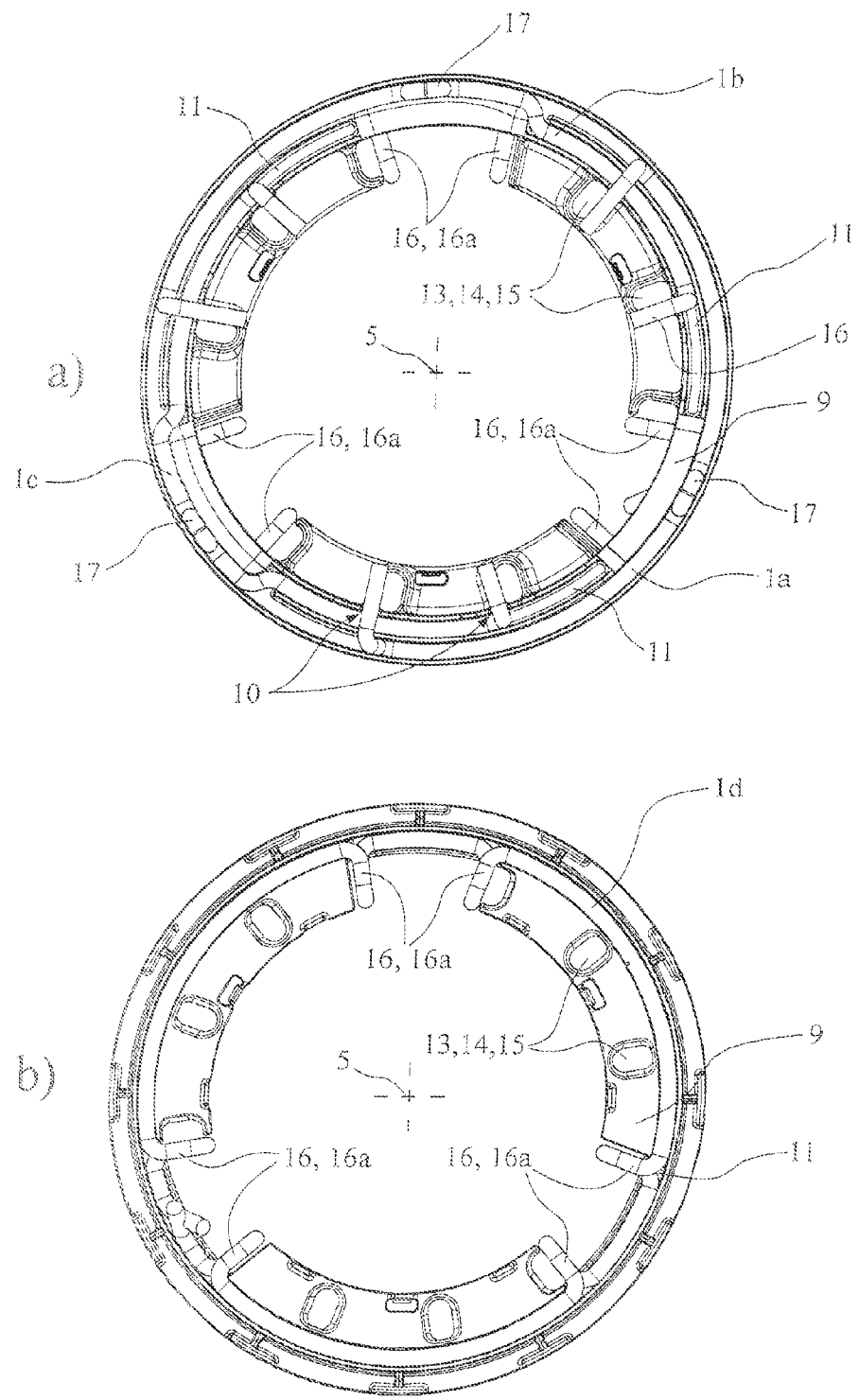
FIG. 3 shows the connection element of the stator according to FIG. 2, a) in a view from above and b) in a view from below, in each case in the dismantled state.

In principle, it is conceivable for the conductor track structure 1 illustrated in FIG. 3 to be embedded in the supporting element 9 in the injection-molding method, which can be carried out in a cost-effective manner in terms of manufacturing.

In this case, however, the supporting element 9 preferably has accommodating parts 10 for the wires 1a-1d and the wires 1a-1d are clipped into the accommodating parts 10 (FIG. 1a)). In this case, the wires 1a-1d are preferably clipped in an axial mounting direction.

Numerous variants are conceivable for the embodiment of the accommodating parts 10. In a particularly preferred embodiment, the accommodating parts 10 are elastically deformable, with the result that the wires 1a-1d can be clipped into the accommodating parts 10 with elastic deformation of the latter. A particularly simple implementation results from the fact that the accommodating parts 10 are formed by wall sections of the supporting element 9, here preferably by recesses in wall sections of the supporting element 9. The accommodating parts 10 are thus preferably integral with the supporting element 9.

For mechanical stabilization, but also for electrical insulation, at least sections of the supporting element 9 are provided with annularly running grooves 11 into which the wires 1a-1d are inserted. The interesting fact in this case again is that these grooves 11 are present on both ends of the supporting element 9.

In order to achieve the respectively desired electrical connection of the stator windings 4, contact is made between the winding ends 12 of the stator windings 4 and the conductor track structure 1. In order to understand the following statements, it is initially important that the stator illustrated in FIG. 2 has, as explained above, twelve stator windings 4 which are each connected in series in pairs, as likewise explained. Only a total of twelve winding ends 12 are accordingly available for making contact with the conductor track structure 1.

In order to be able to provide the winding ends 12 in a mechanically stable manner at the respective contact point, the supporting element 9 has guides 13 for the winding ends 12. In this case, the guides 13 are preferably axial guides 13 which ensure an axial orientation of the winding ends 12.

The winding ends 12 run through the guides 13 of the supporting element 9 in the axial direction based on the motor shaft 5. In this case, the guides 13 are preferably formed by apertures 14 in the supporting element 9, the apertures 14 also preferably each being provided with a funnel-shaped molded portion 15 which faces the stator windings 4 and is intended to center the respective winding end 12 during mounting. The funnel-shaped molded portions 15 can be gathered from the illustration in FIG. 2a).

Sections of the wires 1a-1d substantially follow the ring shape of the supporting element 9 and have contact outwardly bent portions 16 for contact with the winding ends 12. In this case, the contact outwardly bent portions 16 are preferably oriented radially inward based on the motor shaft 5. This means that the contact outwardly bent portions 16 are directed toward the motor shaft 5.

It can best be gathered from the illustration in FIG. 2b) that the contact outwardly bent portions 16 form loops 16a if the respective contact outwardly bent portion 16 is not at an end 16b of the wire 1a-1d. In this case, the loop surfaces are preferably each in a plane which is radially oriented based on the motor shaft 5. In addition, the loop surfaces are oriented substantially parallel to the motor shaft 5. The above embodiment of the contact outwardly bent portions 16 as loops 16a results, overall, in a stable contact structure and, in particular, in double contact of the respective winding end 12, namely at an upper limb and at a lower limb of the respective loop 16a.

The above orientation of the contact outwardly bent portions 16, namely radially inward, results in a compact embodiment. Together with the apertures 14 in the supporting element 9, the available installation space at the end of the stator can thus be used in an optimal manner. In this case, the apertures 14 are arranged between the inner radius and the outer radius of the annular supporting element 9.

The definitive electrical connection between the winding ends 12 and the respective wires 1a-1d is effected by means of soldering, welding or hot caulking. For this purpose, the winding ends 12 with the respective contact outwardly bent portions 16 are pressed against one another by means of a tongs-like arrangement.

In the present case, the connection between the subassembly illustrated in FIG. 2 and a control unit, which can preferably be fitted in this case to that end of the connection element which is free in FIG. 2, in particular can be placed on there, is particularly important. For this purpose, at least one part of the wires 1a-1c has at least one, in this case precisely one, connection outwardly bent portion 17 for electrically connecting the stator.

The stator can be connected to an above control unit (not illustrated) or the like via the connection outwardly bent portions 17. The important factor is now first of all that the connection outwardly bent portions 17 are axially oriented. This means that it is possible to axially place on a control unit in a simple manner.

Furthermore, in this case the connection outwardly bent portions 17 are preferably uniformly distributed over the periphery of the supporting element 9, thus resulting in a symmetrical arrangement in this respect. This is advantageous with regard to the universal use of the stator.

In the embodiment which is illustrated in FIGS. 2 to 5 and is preferred in this respect, the connection outwardly bent portions 17 form loops which provide the connection outwardly bent portions 17 with particular mechanical stability.

Instead of the control unit, a connecting element or the like may also, in principle, be fitted to the connection element, in particular placed on there. For example, it is conceivable for this connecting element to provide a laterally protruding connector for connecting the stator to a control unit or the like.

In summary, it can be pointed out that the effort needed to produce the proposed electrical components can be quite considerably reduced using commercially available round and/or flat wires. Waste of conductor track material virtually does not occur. When using round wires, the mounting process can be particularly robust since damage to other components when inserting the round wire is eliminated.

Mounting by means of clipping in, in the arrangement illustrated in FIGS. 2 to 5, is cost-effective, in particular because it is possible to dispense with additional fastening elements for the conductor track structure 1.

In connection with the embodiment of the supporting element 9, it is finally advantageous that the supporting element 9 can be produced in a cost-effective manner as a simple injection-molded plastic part. With a corresponding design, it is possible to produce the supporting element 9 in a cost-effective manner in the plastic injection-molding method without a slide.

A further teaching likewise with an independent meaning claims a method for producing an electrical component of a motor vehicle. The electrical component is an above-described electrical component with a conductor track structure 1 for providing the electrical connections which are required for operation, which conductor track structure is at least substantially embedded in the plastic housing in the injection-molding method.

The important factor for the proposed method is that the conductor track structure 1 is bent from separate wires before being embedded in the plastic housing, and that any deviation from a straight course goes back solely to a corresponding bending operation, as explained above.

In a preferred embodiment, the wires to be bent differently are bent separately, in particular in a parallel manner, on different bending machines. This may be advantageous when optimizing a production line.

After bending, at least sections of at least one part of the wires are subsequently treated, in particular coated, the coating also preferably being a tin, copper, nickel, silver or gold coating. This coating is carried out, in particular, on the same production line as the bending.

A preferred variant of the coating involves supplying the coating material via a wire and applying said material to the respective section of the respective wire with heat. Other coating variants such as dipping, spraying or the like are conceivable.

After bending and the above, optionally provided subsequent treatment, the wires are fixed relative to one another for the subsequent manufacturing steps. This fixing is effected, in particular, by encapsulating the wires in the plastic injection-molding method. However, it is also conceivable to use clips or the like.

The wires which have been fixed relative to one another in this manner are inserted into a blister as a workpiece holder for further processing and are supplied to further processing. In this case, the further processing may be, in principle, the abovementioned injection-molding of the plastic housing with the inclusion of the conductor track structure 1.

A further teaching likewise with an independent meaning claims an alternative method for producing an electrical component of a motor vehicle.

Unlike the last-mentioned teaching, provision is made here for the conductor track structure 1 to be at least substantially clipped into the plastic housing. This is advantageous, in particular, in terms of mounting. For the rest, all the statements made with respect to the last-mentioned teaching accordingly apply.

Finally, it can also be pointed out that the wires 1a-1d of the conductor track structure 1 may be wires of all possible materials, in particular copper, iron, steel or the like. The wires 1a-1d are expressly not provided with an insulating sheath.

The invention claimed is:

1. An electrical component of a motor vehicle, having a plastic housing and a conductor track structure which is at least substantially embedded in the plastic housing in the injection-molding method and is intended to provide the electrical connections required for operation, wherein the conductor track structure comprises separate wires which each do not run in a straight line, and wherein any deviation from a straight course of the wires goes back solely to a corresponding bending operation in terms of manufacturing,
wherein the electrical component is in the form of a connection element for connecting stator windings of an electric motor via the conductor track structure,
wherein the plastic housing forms a substantially annular supporting element for accommodating the conductor track structure, which supporting element is arranged, in the mounted state, coaxially with respect to a motor shaft at an end of a stator,
wherein sections of the wires substantially follow the ring shape of the supporting element and have contact outwardly bent portions for contact with stator wire winding ends, and
wherein the contact outwardly bent portions are oriented radially inward based on the motor shaft,
wherein the contact outwardly bent portions form loops if the respective contact outwardly bent portion is not at an end of the wire,
wherein surfaces of the loops are each in a plane which is radially oriented based on the motor shaft,
wherein surfaces of the loops are oriented substantially parallel to the motor shaft.

2. The electrical component as claimed in claim 1, wherein at least one part of the wires is bent in a three-dimensional manner.

3. The electrical component as claimed in claim 1, wherein at least one part of the wires, projects from the plastic housing for the purpose of making contact.

4. The electrical component as claimed in claim 1, wherein at least sections of at least one part of the wires is respectively subsequently treated.

5. The electrical component as claimed in claim 1, wherein the wires run substantially along a housing wall.

6. The electrical component as claimed in claim 1, wherein the electrical component is in the form of a drive for a window winder, a drive for adjusting a seat, or a motor vehicle lock.

7. The electrical component as claimed in claim 1, wherein at least sections of the supporting element have annularly running grooves for accommodating the wires.

8. The electrical component as claimed in claim 1, wherein the supporting element has axial guides for the winding ends of the stator windings, and wherein the winding ends run through the guides of the supporting element in the axial direction based on the motor shaft.

9. The electrical component as claimed in claim 1, wherein at least one part of the wires has a connection outwardly bent portion for electrically connecting the stator, wherein the stator can be connected to a control unit or the like via the connection outwardly bent portions, and wherein the connection outwardly bent portions are axially oriented.

10. An electrical component of a motor vehicle, having a plastic housing and a conductor track structure which is clipped into the plastic housing and is intended to provide the electrical connections required for operation, wherein the conductor track structure comprises separate wires which each do not run in a straight line, and wherein any deviation from a straight course of the wires goes back solely to a corresponding bending operation in terms of manufacturing,
wherein the electrical component is in the form of a connection element for connecting stator windings of an electric motor via the conductor track structure, wherein the plastic housing forms a substantially annular supporting element for accommodating the conductor track structure, which supporting element is arranged, in the mounted state, coaxially with respect to a motor shaft at an end of a stator, wherein sections of the wires substantially follow the ring shape of the supporting element and have contact outwardly bent portions for contact with stator wire winding ends, and wherein the contact outwardly bent portions are oriented radially inward based on the motor shaft, wherein the contact outwardly bent portions form loops if the respective contact outwardly bent portion is not at an end of the wire, wherein surfaces of the loops are each in a plane which is radially oriented based on the motor shaft, wherein surfaces of the loops are oriented substantially parallel to the motor shaft.

11. The electrical component as claimed in claim 10, wherein a supporting element has accommodating parts for the wires of the conductor track structure, and wherein the wires are clipped into the accommodating parts.

12. The electrical component as claimed in claim 10, wherein a supporting element has a top side and an underside which are axially opposite based on the motor shaft, wherein one part of the wires is inserted into the top side of the supporting element, and wherein the other part of the wires is inserted into the underside of the supporting element.

13. A method for producing an electrical component of a motor vehicle, the electrical component having a conductor track structure for providing the electrical connections required for operation, which conductor track structure is at least substantially embedded in the plastic housing in the injection-molding method, wherein the conductor track structure is bent from separate wires before being embedded in the plastic housing, and wherein any deviation from a straight course of the wires goes back solely to a corresponding bending operation, wherein the electrical component is in the form of a connection element for connecting stator windings of an electric motor via the conductor track structure, wherein the plastic housing forms a substantially annular supporting element for accommodating the conductor track structure, which supporting element is arranged, in the mounted state, coaxially with respect to a motor shaft at an end of a stator, wherein sections of the wires substantially follow the ring shape of the supporting element and have contact outwardly bent portions for contact with stator wire winding ends, and wherein the contact outwardly bent portions are oriented radially inward based on the motor shaft, wherein the contact outwardly bent portions form loops if the respective contact outwardly bent portion is not at an end of the wire, wherein surfaces of the loops are each in a plane which is radially oriented based on the motor shaft, wherein surfaces of the loops are oriented substantially parallel to the motor shaft.

14. The method as claimed in claim 13, wherein the wires to be bent differently are bent separately on different bending machines.

15. The method as claimed in claim 13, wherein at least sections of at least one part of the wires are respectively subsequently treated.

16. The method as claimed in claim 13, wherein the wires are fixed relative to one another after bending.

17. A method for producing an electrical component of a motor vehicle, the electrical component having a conductor track structure for providing the electrical connections required for operation, which conductor track structure is at least substantially clipped into the plastic housing, wherein the conductor track structure is bent from separate wires before being clipped into the plastic housing, and wherein any deviation from a straight course of the wires goes back solely to a corresponding bending operation, wherein the electrical component is in the form of a connection element for connecting stator windings of an electric motor via the conductor track structure, wherein the plastic housing forms a substantially annular supporting element for accommodating the conductor track structure, which supporting element is arranged, in the mounted state, coaxially with respect to a motor shaft at an end of a stator, wherein sections of the wires substantially follow the ring shape of the supporting element and have contact outwardly bent portions for contact with stator wire winding ends, and wherein the contact outwardly bent portions are oriented radially inward based on the motor shaft, wherein the contact outwardly bent portions form loops if the respective contact outwardly bent portion is not at an end of the wire, wherein surfaces of the loops are each in a plane which is radially oriented based on the motor shaft, wherein surfaces of the loops are oriented substantially parallel to the motor shaft.

* * * * *